United States Patent [19]

Ogawa et al.

[11] 4,418,284
[45] Nov. 29, 1983

[54] SOLID-STATE COLOR-IMAGE SENSOR AND PROCESS FOR FABRICATING THE SAME

[75] Inventors: Kazufumi Ogawa; Shigeru Kondo, both of Hirakata; Yoshiko Yasuda, Sakai; Taketoshi Yonezawa, Ibaraki; Isamu Kitahiro, Yawata, all of Japan

[73] Assignee: Matsushita Electric Industrial Co., Ltd., Osaka, Japan

[21] Appl. No.: 242,577

[22] Filed: Mar. 11, 1981

[30] Foreign Application Priority Data

Mar. 17, 1980 [JP] Japan ................................. 55-33805
Mar. 19, 1980 [JP] Japan ................................. 55-35291

[51] Int. Cl.³ ...................... B29C 27/10; B32B 31/20; H01L 31/18
[52] U.S. Cl. .................................... 250/578; 156/64; 156/99; 156/263; 156/273.5; 156/273.7; 156/275.5; 156/275.7; 156/295; 313/386; 357/31
[58] Field of Search ................ 156/64, 99, 263, 273.3, 156/273.5, 273.7, 275.5, 275.7, 295, 310; 250/578; 313/365, 386; 357/31

[56] References Cited

U.S. PATENT DOCUMENTS 3,867,222 2/1975 Plant et al. ........................ 156/275.5
3,985,918 10/1976 Fukai et al. ........................... 313/386
4,153,526 5/1979 Cherenko et al. ............... 156/275.5
4,321,747 3/1982 Takemura et al. .................... 357/31

Primary Examiner—Michael G. Wityshyn
Attorney, Agent, or Firm—Burgess, Ryan and Wayne

[57] ABSTRACT

In a step for bonding a color filter to a solid-state image sensor so as to provide a color-sensitive image sensor (to be referred to as "a color-image sensor" in this specification), a method for bonding the color filter to the image sensor with an adhesive which is curable by ultraviolet radiation and also the constructions of color filters and image sensors which can facilitate the bonding step. Further techniques for mass producing high-precision and high-quality solid-state color-image sensors, each of which is bonded with a color filter with a higher degree of accuracy in alignment and by a higher degree of adhesive strength, by carrying out the bonding step in an atmosphere containing oxygen so as to inhibit an adhesive squeezed out of the space between the image sensor and the color filter from being cured and subsequently facilitate the removal of uncured adhesive and by forming protective layers or films over the surfaces to be bonded of the image sensor and color filter prior to the bonding step so as to prevent these surfaces from being damaged during the bonding step.

6 Claims, 29 Drawing Figures

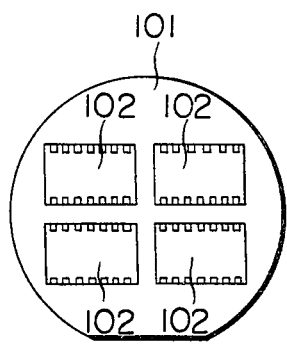
FIG. 5
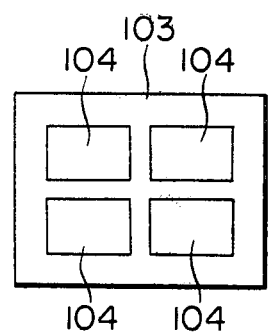
FIG. 6
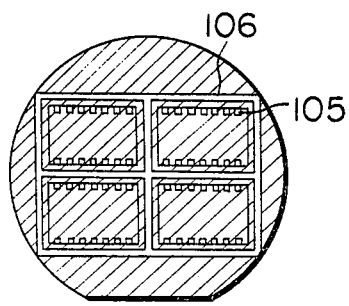
FIG. 7
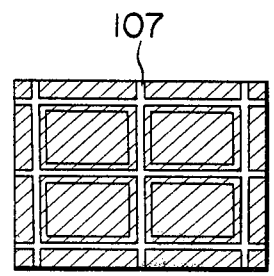
FIG. 8
FIG. 9
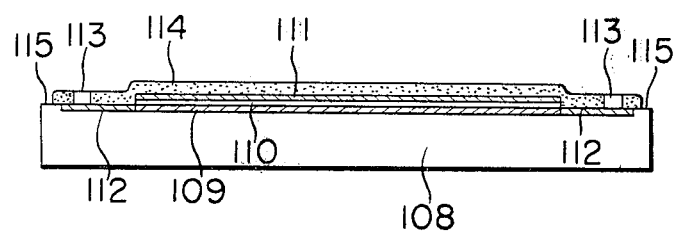
FIG. 10
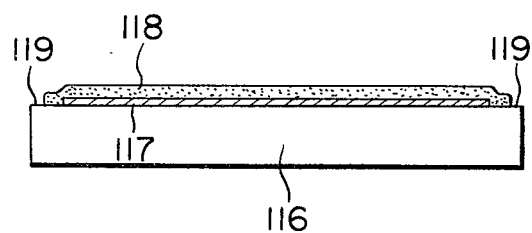

x100,000 x100,000

SOLID-STATE COLOR-IMAGE SENSOR AND PROCESS FOR FABRICATING THE SAME

BACKGROUND OF THE INVENTION

The present invention relates to a solid-state color-image sensor in which a picture-element grid is surrounded with a light-shielding layer which in turn covers desired portions such as a driving circuit on the sensor so that unwanted signals; that is, noise may be prevented. The present invention also provides a process and construction of color filters and image sensors for fabricating the solid-state color-image sensors of the type described in a simplified manner.

The prior art solid-state color-image sensors and processes for fabricating the same will be described in detail with reference to FIGS. 1 and 2 of the accompanying drawings.

SUMMARY OF THE INVENTION

A first object of the present invention is to provide a process for fabricating solid-state color-image sensors and more particularly a method for bonding a color filter to a solid-state image sensor chip with an adhesive which is curable by ultraviolet radiation.

A second object of the present invention is to provide the construction of optical filters and solid-state image sensor chips which can facilitate the bonding step with an adhesive curable by ultraviolet radiation.

A third object of the present invention is to provide a method for curing only an adhesive sandwiched between a color filter and a picture-element grid on an image sensor chip, leaving the adhesive squeezed out of the space therebetween uncured.

A forth object of the present invention is to provide techniques for the mass production of high-precision and high-quality solid-state color-image sensors by preventing surface flaws due to contaminant particles during the bonding step.

To the above and other ends the present invention provides a method for bonding a color filter to a solid-state image-sensor chip with an adhesive which can be cured by ultraviolet radiation so as to render the solid-state image sensor chip color sensitive.

The present invention further provides the construction of color filters and solid-state image-sensor chips which can facilitate the bonding step or method described above.

The present invention also provides techniques for the mass production of solid-state color-image sensors, in each of which a color filter is bonded to a solid-state image-sensor chip with a higher degree of accuracy in alignment, the techniques being characterized by carrying out the bonding or curing step in an atmosphere containing oxygen so as to inhibit the adhesive squeezed out of the space between a color film and an image-sensor chip from being cured, thereby facilitating the removal of uncured or unwanted adhesive and by forming protective layers or films over the surfaces to be bonded together of the color filter and image-sensor chip prior to the bonding or curing step, thereby preventing these surfaces being damaged during the bonding or curing step.

BRIEF DESCRIPTION OF THE DRAWINGS

FIG. 5 is a top view of a semiconductor wafer upon which are fabricated a plurality of solid-state color-image sensor elements to be divided into individual chips;

FIG. 6 is a top view of an optical glass substrate or wafer upon which are printed or otherwise formed a plurality of color filters to be divided into individual ones;

FIG. 7 and FIG. 8 show the wafer and the optical glass substrate or wafer shown in FIGS. 5 and 6, respectively, and covered with protective layers;

FIG. 9 is a sectional view of a solid-state color-image sensor chip;

FIG. 10 is a sectional view of a color filter;

DETAILED DESCRIPTION OF THE PRIOR ART

Figure 1:
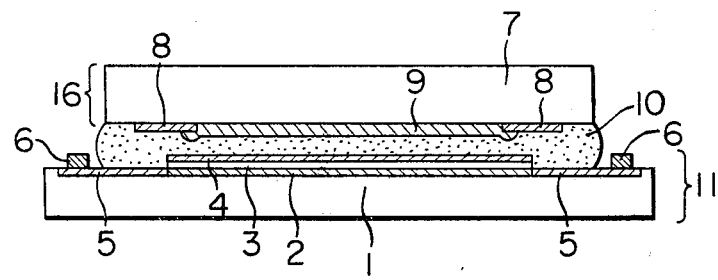
FIG. 1 is a sectional view of a prior art solid-state color-image sensor.

The solid-state color-image sensors will be increasingly used in video cameras so as to make them compact in size and light in weight. FIG. 1 shows a prior art solid-state color-image sensor comprising a solid-state color-image sensor element or chip to which is bonded or cemented a color filter. When a three-color (for instance, red, green and cyanblue) stripe or mosaic color filter is used, a solid-state color-image sensor can be used as a single-plate image sensor for color video cameras.

The solid-state color-image sensor chip 11 comprises a picture-element grid 2 fabricated over one major surface of a silicon substrate 1, a photoconductive layer 3, a transparent electrode 4, a driving circuit 5 and bonding pads 6. The color filter which comprises a glass substrate 7, a filter pattern 9 and a light-shielding layer 8 consisting of, for instance, a chrome layer and surrounding the filter pattern 9 is bonded over the color-image sensor chip 11 with an adhesive 10 which is substantially transparent to the visible rays. It is preferable or advantageous to use adhesives which are curable by light irradition because the thickness of the adhesive bond layer can be sufficiently reduced. In addition, the alignment of the three-color stripe or mosaic pattern on the color filter with the picture-element grid on the color-image sensor chip 11 may be facilitated. That is, the color filter 16 is pressed against the color-image sensor chip 11 with the adhesive 10 interposed therebetween and the filter pattern on the color filter is aligned with the picture-element grid pattern on the chip 11. Thereafter, the adhesive is subjected to light or ultraviolet radiation. The light-shielding layer 8 is provided to define a picture frame for a color-image sensor so that unwanted signals, that is, noise may be prevented from being generated by the light rays incident to portions except the picture frame.

The solid-state color-image sensor of the type shown in FIG. 1 has some drawbacks to be described below. In order to cure the adhesive 10, thereby bonding the color filter 16 to the chip 11, light is irradiated above the glass substrate 7, but the adhesive 10 immediately below the light-shielding layer 8 remains uncured because it is not exposed to light. So far the adhesive 10 below the light-shielding layer 8 is left uncured. Alternatively, an adhesive containing a thermosetting initiator is used so that the adhesive 10 which remains uncured below the light-shielding layer 8 can be cured by heating. However, the filter pattern 9 on the color filter 16 and the photoconductive layer 3 on the chip 11 have a lower degree of resistance-to-heat, so that there is a fear that they are degraded by heating. As a result, a thermal curing step must be carried out at a low temperature for a long time interval. Then, the most important feature of radiation-curable adhesives; that is, a short curing time is lost. In addition, the solid-state color-image sensors which have been subjected to curing by heating become not reliable in operation.

Figure 2:
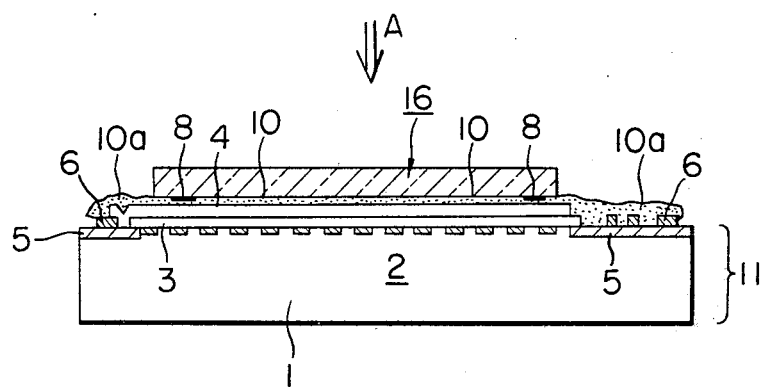
FIG. 2 is a view used for the explanation of an adhesive squeezed out from the space between a color filter and a solid-state image sensor chip when they are pressed against each other.

When the ultraviolet-ray curable adhesive 10 is used for bonding the color filter 16, it very frequently spreads out of the color filter 16, thereby covering the output pads 6 as shown in FIG. 2. Therefore, when the color-image sensor subassembly is subjected to the ultraviolet rays, the adhesive 10 over the input and output pads 6 is also cured so that no fine lead wires can be bonded to them in a packaging step.

One of the remedies is to remove the adhesive 10a which has been spread or squeezed out of the color filter 16 by means of a suitable organic solvent. However, the organic solvent tends to penetrate into the adhesive layer 10 between the color filter 16 and the transparent electrode 3, thus causing adverse effects on the bonding between them. Thus, it is impossible to remove only the adhesive 10a covering the input and output pads 6.

Another remedy is to shield the input and output pads with a suitable optical shielding means when the chip is subjected to the curing step and thereafter to remove the adhesive on the input and output pads 6 with a suitable organic solvent. However, it is very difficult to carry out this remedy in practice because the shielding mask must be registered with the chip within a tolerance of plus or minus hundreds microns and because of the defraction problem of untraviolet rays.

The prior art solid-state color-image sensors have a further drawback resulting from the fact that the surfaces of the color filter 16 and the chip are very soft, so that they are easily damaged by rough handling. The chance of their surfaces being damaged is high especially when the substrate or wafer is sectioned into individual tips or dies. Furthermore, resistance-to-heat and resistance-to-chemical of the color filter 16 are low, so that it had been difficult to clean it sufficiently. As a result of the surface flaws, the yield of the prior art solid-state color-image sensors had been low. Thus, elimination or reduction of surface flaws to a minimum had been the most difficult problem to be left unsolved in the production of the solid-state color-image sensors.

DESCRIPTION OF THE PREFERRED EMBODIMENTS

First Embodiment

Figure 3:
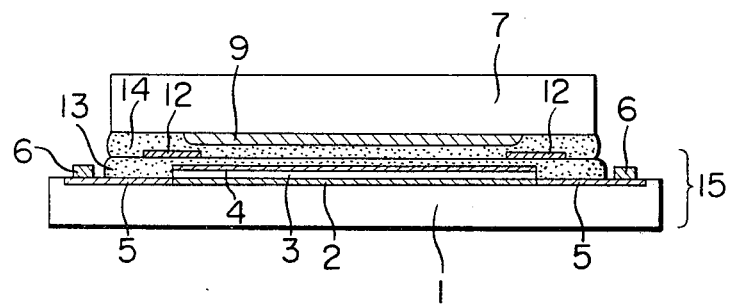
FIG. 3 is a sectional view of a first embodiment of the present invention.

In FIGS. 3 and 4, the same reference numerals as those used in FIG. 1 are used to designate similar parts.

Figure 4A:
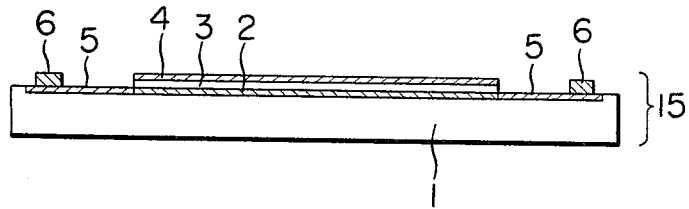
FIGS. 4A to 4D show a sequence for bonding a color film to an image sensor chip according to the present invention.
Figure 4B:
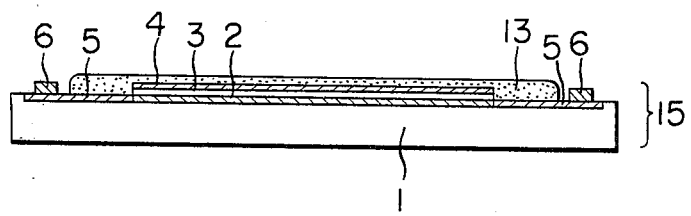
Figure 4C:
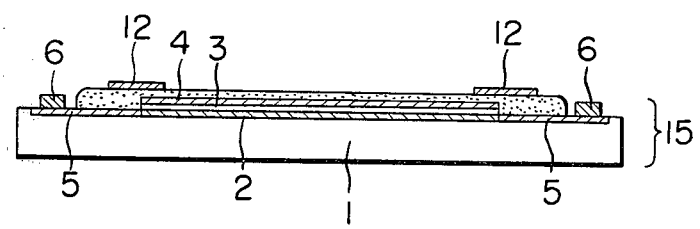
Figure 4D:
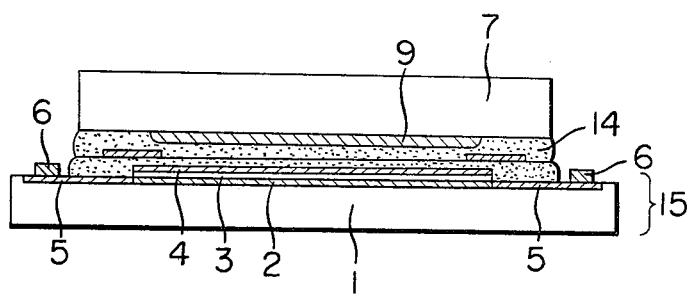
Figure 11:
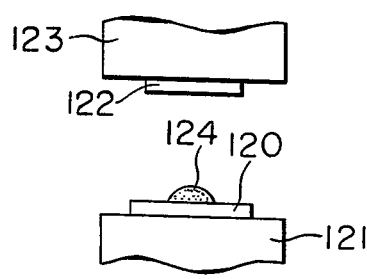
FIGS. 11 and 12 are views used for the explanation of the sequence for filling an adhesive between a color filter and a solid-state color-image sensor chip.

A chip 15 bearing an image sensor element or circuitry is coated with a resin film 13 which is substantially transparent to visible rays. It is preferable that the transparent resin film 13 is formed with a resin which is curable by light irradiation or more particularly by ultraviolet radiation. The resin layer 13 may be formed by use of for instance a spin-coating means. It is not needed to cover the bonding pads 6 because in the curing step by ultraviolet-ray irradiation, they are masked so that the adhesive which remains uncured may be readily removed with a suitable organic solvent. The resin film 13 which is formed over the transparent electrode 4 is preferably two $\mu$m in thickness. The resin film 13 physically and chemically protects the chip 15. Resins or plastics which are curable by ultraviolet-ray irradiation and have resistance-to-heat up to 250° C. are readily available (for instance, a product of Norland Corp. sold under the trademark of "NOA-61" or a product of W. R. Grace Corp. sold under the trademark of "OPL 7"), and the thermal resistance of the photoconductive layer 3 is lower than 250° C. so that it can be well protected by the resin layer 13 against heat. According to the present invention, a light-shielding layer 12 consisting of chrome or the like is formed over the resin film 13 by a photolithographic process or a vacuum evaporation process with a suitable mask so as to surround the picture-element grid 2 so that unwanted signals may be prevented from being generated as described previously. The chip 15 per se (as shown in FIG. 4C) or with a protective glass cap may be used as an image sensor, but according to the present invention, the color filter 9 is bonded to the chip 15 with an adhesive 14 which is curable by light radiation or more particularly by ultraviolet-ray irradiation. Furthermore, it is preferable that an adhesive to be used has the same optical properties as those of the protective resin layer 13 when cured so that reflections and refractions of light rays at the interface between the protective layer 13 and the adhesive bond layer 14 may be avoided.

Next the bonding step will be described in more detail below. A suitable amount of an adhesive which is curable by ultraviolet radiation is dropped at the center of the chip 15 after the light guard band 12 is formed. The glass substrate 7 bearing the color filter pattern 9 is pressed against the chip 15 so that the adhesive 14 is spread over the surfaces of the color filter and the chip 15 to be bonded, without bubbles being trapped therebetween. The glass substrate 7 is so pressed that the resultant adhesive layer 14 becomes as thin as possible. While the substrate 7 is pressed against the chip, an operator attains the alignment between the filter pattern 9 of the color filter and the picture-element grid 2 on the chip 15 through a microscope from above. After the pattern 9 and the grid 2 have been correctly aligned with each other, the microscope is retracted and ultraviolet rays are projected from above so as to cure the adhesive 14. A clamping device for pressing the color filter to the chip 15 must be so designed and constructed that the alignment through the microscope will not be obstructed and the ultraviolet rays can be transmitted through the clamping means to the adhesive 14. That is, it is preferable that the clamping means is made of a transparent acrylic plate. The force required for displacing the color filter 7 relative to the chip 15 for alignment can be transmitted to the glass substrate 7 through a frictional engagement between the acryl plate and the substrate 7. In the first embodiment shown in FIGS. 3 and 4, no protective film or layer is formed over the color filter pattern 9, but it is understood that the filter pattern 9 may be of course covered with a protective film or layer of a resin or plastic which is cured by light radiation in a manner substantially similar to that described previously in conjunction with the formation of the protective resin layer 13. When the color filter is covered with a protective layer, its handling will be, of course, much facilitated.

In summary, according to the first embodiment, the whole adhesive 14 can be exposed to light radiation so as to be cured so that the color filter can be securely bonded to the chip 15 immediately after the alignment therebetween has been attained. As a result, the bonding step can be much simplified and accomplished in a very short time. In addition, the step for forming the light-shielding layer around the filter pattern 9 on the color filter can be eliminated, so that the yield of color filters can be increased and the color filters become highly reliable in operation. That is, since the light-shielding layer 12 is not in direct contact with the substrate 1 and the glass substrate 7 of the color filter, so that the freedom in design and fabrication of both the chips 15 and the optical filters can be improved. As a result, overall reliability can be further improved.

Second Embodiment

The light-curing initiators used in the present invention includes benzophenone, thioxanthone and benzathrone and the thermal curing initiators used in the present invention include radial initiators such as benzopinacole. A curing time or rate of an ultraviolet-ray and thermally-curable adhesive such as a thiol-ene series adhesive such as "NOA-61 or RCP-611u" described previously is dependent of the concentration of a radial initiator. However, when such adhesive is exposed to the oxygen, rapid decrease in radicals results, so that curing will not proceed. For instance, curing proceeds in the following steps:

Initiation of curing:

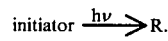

Chain reactions:

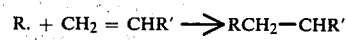

Termination of reactions:

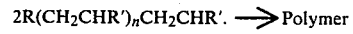

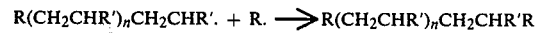

When the initiator is benzophenone and the reactions or curing is carried out in the oxygen atmosphere, radicals vanish in the following steps:

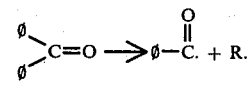

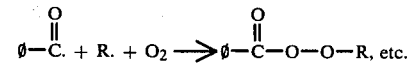

That is, the radicals produced when irradiated with radiation are rapidly vanishing so that curing will not proceed.

Therefore, when the step for bonding the color filter 1 to the chip 16 is carried out in the oxygen atmosphere with an ultraviolet-ray curable adhesive whose curing proceeds at the presence of a radial initiator, the adhesive 10a which is squeezed out of the color filter 1 as shown in FIG. 3 can be prevented from being cured and the adhesive 14 which is sandwiched between the color filter 1 and the picture-element grid 6 or more particularly the transparent electrode 13 can be prevented from being exposed to the surrounding atmosphere. As a result, curing proceeds quickly. After the adhesive 14 sandwiched between the color filter 1 and the chip 16 has been cured, the adhesive 10a which is squeezed out and remains uncured can be selectively removed with a suitable organic solvent.

Strictly speaking, the oxygen is not sufficiently diffused into the adhesive 10a which is squeezed so that curing proceeds to some extent within the adhesive 10a. However, in practice the adhesive 14 sandwiched between the color filter 1 and the chip 16 is about 10 μm in thickness while the squeezed-out adhesive 14a is hundreds microns which is by far thicker than the adhesive layer 14. Thus only the sandwiched adhesive layer 14 can be completely cured without curing the interior of the squeezed adhesive 14a by suitably controlling the irradiation intensity and time interval.

For instance, the adhesive or "NOA-61" layer 14 which is sandwiched between the color filter 1 and the chip 16 and which is about 10 μm in thickness can be completely cured in the atmosphere containing about 20% of the oxygen by the irradiation of ultraviolet rays at the intensity of 58 mW.S./cm² with a high-pressure mercury-vapor lamp. Thereafter, the squeezed-out adhesive 14a can be selectively removed completely with an organic solvent.

Since a thermosetting initiator such as benzopinacole is added, the squeezed-out adhesive 10a whose interior remains uncured can be completely cured by heating.

In summary, according to the third embodiment, only the adhesive layer 14 sandwiched between the color filter 1 and the chip 16 can be cured by the first step of bonding the color filter 1 to the chip 16 while the squeezed-out adhesive 14a which covers the bonding pads 9 remains uncured. As a result, the squeezed-out adhesive 10a can be easily removed with a suitable organic solvent and consequently the step for bonding fine lead wires to the input and output pads 9 can be made facilitated. Thus, the assembly costs of the solid-state color-image sensors can be considerably reduced.

Third Embodiment

As shown in FIG. 5, a plurality (four in FIG. 5) or solid-state color-image-sensor elements or chips 102 are fabricated over the surface of a silicon wafer 101.

As shown in FIG. 6, a plurality (four) of color filters 104 are formed on an optical glass substrate 103.

These wafer 101 and substrate 103 are preferably fabricated by a contamination-free process and then coated with protective films or layers immediately after the chips 102 and the color filters 104 have been fabricated. According to the third embodiment, therfore, the chips 102 and the color filters 104 are coated by the spin-coating process with an ultraviolet-ray-curable resin such as "OPL 7", a trademark of product of W. R. Grace Corp., which is low in viscosity and then is irradiated with the ultraviolet rays so that uniform protective layers may be formed. The ultraviolet-ray-curable resins used for forming such protective layers preferably have the following properties:

(i) Viscosity lower than 500 cps in order to obtain a uniform thickness of about 2 $\mu$m of the protective layers.

(ii) They have a uniform and preferably high transmission coefficient for the visible rays.

(iii) They preferably exhibit a higher degree of sensitivity so that they can be cured with a small quantity of ultraviolet radiation in order to prevent the degradation or changes in characteristics of the color filter due to an excessive irradiation.

However, it should be remembered that the bonding pads on the chips 102 must not be coated with the protective layers. A process for removing undesired protective layers over the bonding pads has been well known in the art, but according to the present invention, the ultraviolet-ray-curable resins are used so that a proximity printing with a noncontact mask may be used in a curing step with the ultraviolet radiation and consequently the resin layers on the bonding pads remain uncured and can be removed with a suitable solvent.

The experiments conducted by the inventors showed that the protective layers or coatings tend to be separated from the chips 102 and the color filters 104 are sectioned with a grinding wheel. As a result, the succeeding steps are adversely affected. Therefore, it is preferable that, as shown in FIGS. 7 and 8, isolation lines 106 and 107 are masked in the step for irradiating the ultraviolet rays, so that the protective layers along the isolation lines 106 and 107 remain uncured and subsequently can be removed with a suitable organic solvent. In FIGS. 7 and 8, the protective layers are hatched and the isolation lines 106 and 107 are not covered with the protective layers.

The wafer 102 and the optical glass substrate 103 are sectioned along the axes of the isolation lines 106 and 107 with a grinding wheel which is spinning at a high speed. That is, after the grinding wheel has cut relatively deep grooves along the isolation lines 106 and 107, the wafer 101 and the optical glass substrate 103 can be sectioned or fractured along the scribe lines into individual chips. In the latter case, a diamond-tipped scribe, a diamond-edged saw or a laser scriber can be used.

FIG. 9 shows in section a sectioned chip bearing a solid-state color-image sensor comprising a silicon substrate 108, a picture-element grid 109, a photoconductive layer 110, a transparent electode 111 and a driving circuit 112. The transparent electrode 111 is coated with a protective coating 114. A mask was so placed in the step for irradiating ultraviolet radiation that bonding pads 113 and the peripheral portions 105 of the silicon substrate 108 are not covered with protective layers.

FIG. 10 shows in section a sectioned color filter chip comprising an optical glass substrate 116, a three-color filter pattern 117 and a protective coating 118. The peripheral portions 119 of the substate 116 are not covered with protective layers.

When the wafers or optical glass substrates of the types described are sectioned or divided into individual chips, the latter tend to be contaminated with chips or particles and cooling liquids. However, according to the present invention, the optical filter is covered with the protective coating 118, so that after the sectioning or dividing step, it may be subjected to a cleaning step and consequently may be completely free from contaminants. Thus, as compared with the prior art fabrication processes which provide no protective coating, the present invention can attain a high yield.

After the sectioning or dividing step, the solid-state color-image sensor clip 120 is mounted on a lower stage 121 while the optical or color filter chip 122 is mounted on an upper stage 123. The upper and lower stages 123 and 122 are so aligned that the centers of the chips 120 and 122 are registered. The color filter chip 122 must be securely held in position by a vacuum suction holding means or the like. On the other hand, the color-image sensor chip 120 may be merely placed on the lower stage 121 or more preferably it is securely held in position also by a vacuum suction holding means or the like.

After the chips 120 and 122 have been securely held in position in the manner described above, a suitable amount of an adhesive 124, which is curable not only by the ultraviolet-ray irradiation but also by heating, is dropped at the center of the color-image sensor chip 120 by means of a suitable dispenser means which is commercially available and is capable of dispensing a predetermined amount of adhesive. The adhesive 124 preferably assumes a liquid drop due to its surface tension. In addition, the adhesive 124 exhibits the same optical properties when cured as the protective layer. Especially the closer the refractive index of the adhesive 124 is to that of the protective layer, the more satisfactory results can be obtained.

Figure 12:
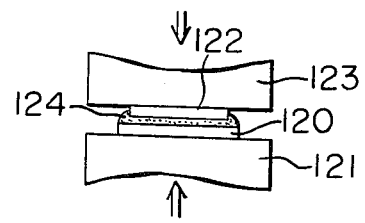

Next, the upper and lower stages 123 and 121 are moved toward each other while their opposing surfaces are maintained in parallel with each other, so that the adhesive 124 may be spread over the surface of the color-image sensor chip 120 and subsequently be uniformly filled between the chips 120 and 122 as best shown in FIG. 12. As the chips 120 and 122 are moved toward each other, first the center portions thereof are made into contact with each other and then the contact interface is gradually spreading outwardly so that no bubble will be trapped between them. Thus, according to this embodiment, it is not needed to make the upper and lower stages 123 and 121 press against each other under a high pressure, but the adhesive 124 can be uniformly spreaded or distributed between the chips 120 and 122 without trapping any bubble.

Next, the color filter chip 122 is released from the upper stage 123 and then the upper stage 123 is retracted upward.

Figure 13:
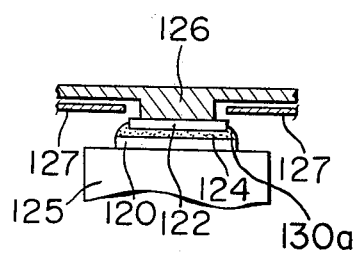
FIG. 13 is a view for the explanation of a alignment-and-bonding step.

The correct registration between the color filter chip 122 and the color-image sensor chip 120 can be attained by displacing them relative to each other. According to the embodiment, the color filter chip 122 is held stationary while the color-image sensor chip 120 is displaced relative to the chip as will be described in detail below. That is, as the lower stage 121 is displaced, the color-image sensor chip 120 preferably is securely held in position by means of a vacuum suction clamping device or the like as described previously. When the lower stage 121 is not displaced for alignment, the chip assembly, that is, the chips 120 and 122 with the adhesive 124 sandwiched between them is transferred to an alignment stage 125 and securely held in position by a vacuum suction clamping means or the like as shown in FIG. 13. A pressure plate 126 exerts a suitable pressure on the upper surface of the color filter chip 122. Since the color filter chip 122 must be held stationary during the alignment step, a vacuum suction clamping means or the like may be used, but when the pressure plate 126 is pressed against the upper surface of the color filter chip 122 in such a way that they are made into high frictional engagement as shown in FIG. 13, the adhesive 124 serves as a lubricant, so that the color-image sensor chip 120 can be displaced with the color filter chip 122 which is held stationary. Therefore, it is preferable that the contact surface of the pressure plate 126 is partially or wholly coated with a thin viscous film.

The pressure plate 126 is partially or wholly made transparent to the visible light range as well as the range of wavelengths which are absorbed by the adhesive 124 which in turn is curable by the ultraviolet irradiation. An operator observes through a microscope above the pressure plate 126 so as to attain the correct alignment or registration between the color filter chip 122 and the color-image sensor chip 120. To put into another way, the alignment is attained by observing the alignments marks on the chips 120 and 122 and aligning them so that the pressure plate 126 must be provided a transparent window through which operator can observe the alignment marks.

During the alignment step, the pressure plate 126 must be pressed against the color filter chip 122 and hence against the solid-state color-image sensor chip 120 under a suitable pressure. If the adhesive layer 124 between them can be maintained sufficiently thin less than 10 μm and when the ultraviolet rays are irradiated from the above, they are transmitted through the pressure plate 126, which is partially or wholly transparent as described previously, to the adhesive layer 124, so that the latter is partially or wholly cured and consequently the chips 120 and 122 are partially or wholly bonded together. When the thickness of the adhesive layer 124 cannot be made sufficiently thin, it suffices merely to increasing the exerting pressure of the pressure plate 126.

As described many times previously, the adhesive sequeezed out of the space between the chips 120 and 122 most frequently tends to cover the bonding pads during the curing step with the ultraviolet irradiation so that the squeezed-out adhesive is cured. As a result, the adhesive cured on the bonding pads must be removed. One of the remedies for this problem has been already described in conjunction with the second embodiment, but according to the third embodiment a mask 127 is provided so as to shield the bonding pads and subsequently to prevent the adhesive on them from being cured.

During the ultraviolet irradiation step following the alignment step, at least one portion of the adhesive layer 124 is cured so that the chips 120 and 122 are partially bonded to each other as described previously. Therefore, the bonded chips 120 and 122, which are now a unitary construction, are removed out of the alignment device, so that in the subsequent steps, the undesired adhesive on for instance the bonding pads is removed with a suitable organic solvent and then the adhesive which remains uncured can be cured by the ultraviolet irradiation again.

Figure 14:
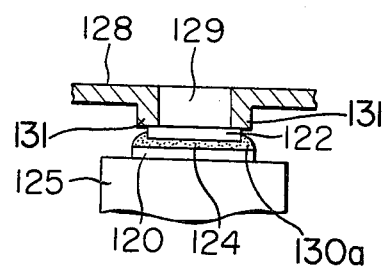
FIG. 14 is a view used for the explanation of another alignment-and-bonding step.

In FIG. 14 is shown another step for aligning the chips 120 and 122 and irradiating the adhesive 124 with the ultraviolet rays. A pressure plate 128 is formed with a pressure pad which is extended downward and which has a through opening 129. Therefore, the pressure pad presses only the peripheral portions of the color filter chip 122 and the ultraviolet rays are irradiated through the through opening 129.

In general, because of the difference in coefficient of thermal expansion of the optical glass substrate from that of the film pattern of the color filter chip 122, the film pattern side which is made into contact with the color-image sensor chip 120 is convex downward. Similarly, the upper surface of the color-image sensor chip 120 is convex upward because of the formation of an oxide film or the like. Therefore, when the chips 120 and 122 are pressed against each other, their convex surfaces are flattened while the adhesive 124 between them is uniformly thinned in a simple manner.

The second embodiment may be used, but according to the third embodiment the bonding pads and the areas adjacent to them are not irradiated with the ultraviolet rays, so that the adhesive which remains uncured thereover can be removed with a suitable organic solvent. Thereafter, the adhesive 130a which remains uncured below the light-shielding portions or optical guard bands 131 can be completely cured by heating.

Figure 15:
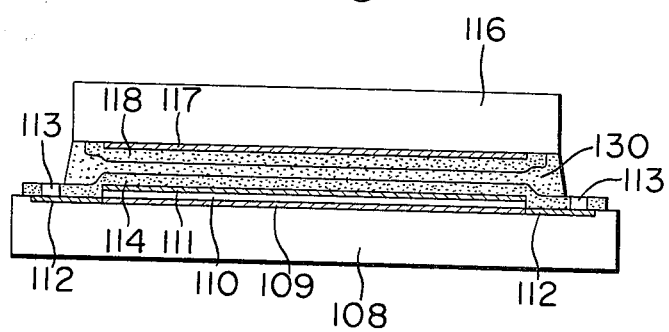
FIG. 15 is a sectional view of a solid-state color-image sensor chip with a cemented color filter.

In FIG. 15 is shown in section a finished solid-state color-image sensor. Reference numerals used in FIGS. 9 and 10 are also used here to designate similar parts. The solid-state color-image sensor chip and the color filter chip shown in FIGS. 9 and 10 are bonded together with an adhesive 130. The overall thickness of the protective coatings 114 and 118 and the adhesive layer 130 is less than 10 μm. They can be so easily controlled that, for instance, the protective coatings 114 and 118 have a thickness of 2 μm while the adhesive layer 130 has a thickness of 5 μm. Reference numeral 131 designates a light-shielding layer.

According to this embodiment, it becomes very simple to attain optical matchings between the protective coatings which cover the surfaces of the image sensor chip and the color filter chip and which are cured with the ultraviolet ray irradiation and the adhesive layer between these chips which is also cured with the ultraviolet ray irradiation. As a result, the reflections due to the difference in refractive index can be eliminated and the optical transmission losses can be reduced to a minimum.

According to the third embodiment, the yield can be remarkably improved and the number of fabrication steps can be reduced to a minimum because an adhesive can be cured by irradiation with ultraviolet rays for a short time interval and then by heating.

The third embodiment will contribute greatly to the reduction in size and cost and improvement of performance of the solid-state color-image sensors.

Fourth Embodiment

Figure 16:
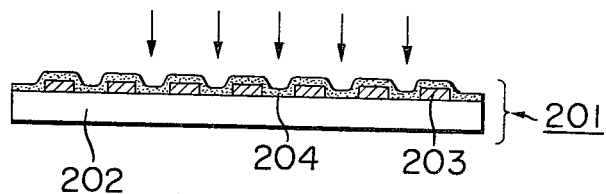
FIG. 16 is a sectional view of a color filter for a single-plate color-image sensor.
Figure 17A:
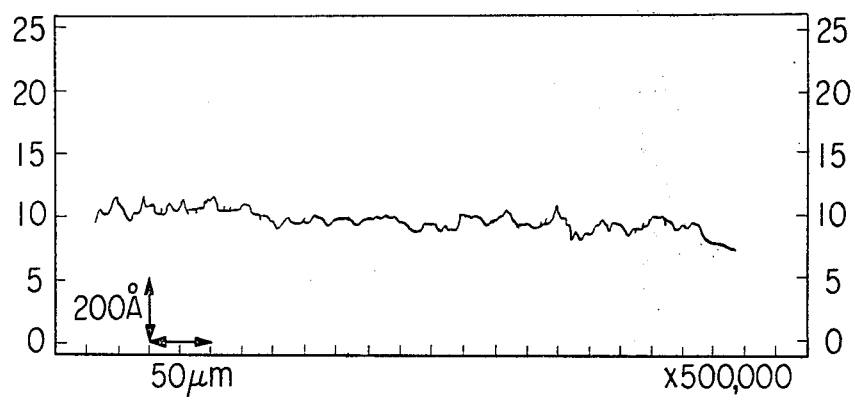
FIG. 17A shows surface roughness of a color filter of the present invention prior to be subjected to a sputtering treatment.
Figure 17B:
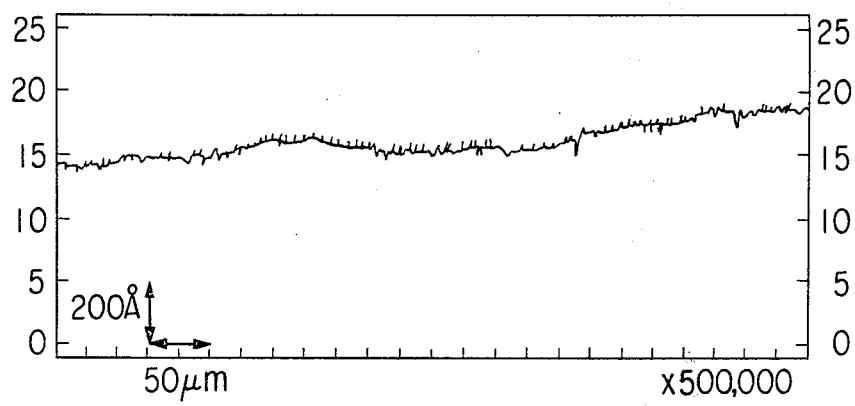
FIG. 17B shows surface roughness after the sputtering treatment.
Figure 18A:
FIG. 18A is a photo showing the surface of a color filter prior to a sputtering treatment.
Figure 18B:
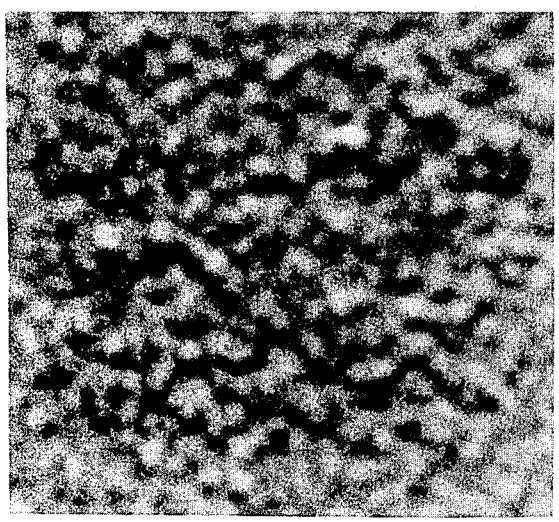
FIG. 18B is a photo showing the surface thereof after the sputtering treatment.

In the third embodiment the color filter has been described as being covered with the protective layer or film. In the fourth embodiment, as shown in FIG. 16, a protective resin layer 204 consisting of polymethyl methacrylate or polyurethane plastic and formed over a filter pattern 203 is removed by a predetermined amount by a sputtering process. The sputtering parameters of conditions:

(1) Atmosphere: contains the $O_2$ gas
(2) Vacuum: 0.15 torr
(3) Excitation potential: 50 W
(4) Excitation time: 2 minutes In FIG. 16, reference numeral 201 designates the whole color filter and 202, a transparent glass substrate. As a result of the sputtering process, surface roughness changes from 3 to 4 nm as shown in FIGS. 17A and 17B. FIGS. 18A and 18B are SEM photos showing the surface of the protective layer prior to and after the sputtering process.

The filter pattern protective layer is initially 200 nm in thickness and is reduced to 150 nm by the sputtering. In practice, under the above-described sputtering conditions, the amount of the protective layer removed is 100 nm in terms of thickness.

In order that the protective layer on each color filter chip may be removed by the same amount, the removal rate must be adjustable within a predetermined range. For this purpose, the excitation potential is set to 20 W. Then the removal rate becomes 50 nm/min.

Figure 19:
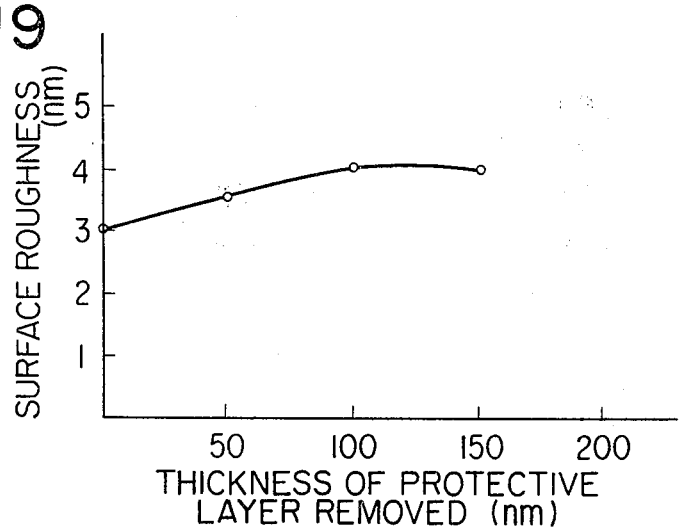
FIG. 19 shows the relationship between the sputtered amount in terms of thickness and the surface roughness.

As shown in FIG. 19, surface roughness remains almost unchanged until the protective layer is removed by the amount of 150 nm in terms of thickness as shown in FIG. 19 and is 4 nm at the maximum. The transmission coefficient was measured with a spectrometer but no significant change was observed. In other words, even when surface roughness changes from 3 to 4 nm, no adverse effect will result.

The characteristics of the color filter will not be adversely affected.

Figure 20:
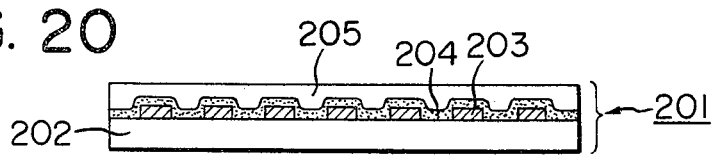
FIG. 20 is a sectional view of a color filter covered with a protective layer in accordance with the present invention.

As shown in FIG. 20, an ultraviolet-ray-curable resin (such as a thiol-ene series resin which is a product of W. R. Grace Corp. solid under a trademark of "OPL 7") is applied to a thickness of 2.5 μm over the surface of the color filter 210, which has been sputtered as described previously, and cured to form a protective layer 205. The color filter 201 is then cleaned with an ultrasonic cleaning device with an output of 150 W, but no separation is observed.

When the prior art color filters are cleaned by an ultrasonic cleaning device with an output of 100 W, separation results, but no separation will result in the color filter in accordance with the present invention even when the output is increased to 150 W. As a result, the color filter can be thoroughly cleaned in a succeeding step.

According to the fourth embodiment, a higher degree of adhesion strength may be imparted to an optical component without causing its degradation (the decrease in transmission coefficient) when a protective layer is formed over the surface of the optical component.

In addition, resistance-to-cleaning can be improved.

Furthermore, the adhesion strength to an organic compound can be considerably increased.

Fifth Embodiment

Figure 21A:
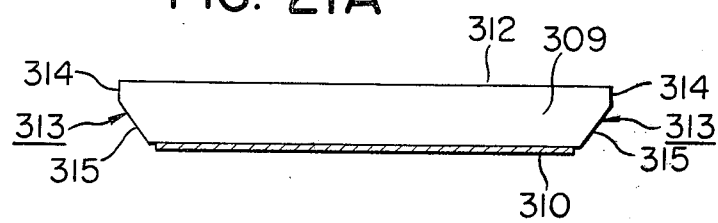
FIG. 21A is a side view of an embodiment of a color filter in accordance with the present invention.
Figure 21B:
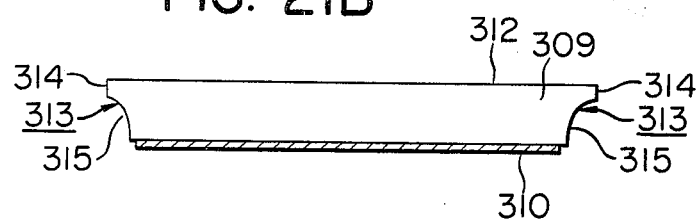
FIG. 21B is a side view of another embodiment thereof.

According to a fifth embodiment of the present invention, the side walls 313 of an optical glass substrate 309 are inclined or curved inwardly as shown in FIG. 21A or FIG. 21B, so that the side edges of a colored pattern layer 310 are located inwardly of those of the upper surface 312 of the substrate 309. However, the upper edge of the tapered, inclined or curved side wall portion 315 must be such that the straight wall portion 314 may be left, the height of the straight wall portion 314 being from 50 to 150 μm when the substrate 309 is 500 μm in thickness. The straight wall portions 314 serves to prevent the edges of the glass substrate 309 from cracking. The tapered, inclined or curved wall portions 313 must be so shaped that an adhesive reservoir 315 capable of holding a suitable amount of adhesive may be formed on each side.

Figure 22:
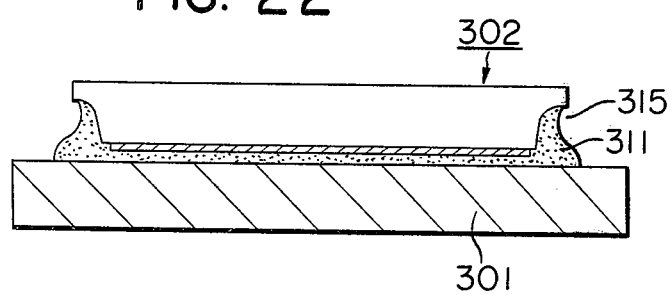
FIG. 22 shows the color filter shown in FIG. 21B which is bonded to a solid-state color-image sensor chip.

The color filter 302 of the type described above is bonded to a solid-state color-image sensor chip 301 as shown in FIG. 22. An adhesive 311 squeezed out between the chip 301 and the color filter 302 is received in the adhesive reservoirs 315, so that it is prevented from being spread over the upper surface of the color filter 302.

So far the substrate of the color filter has been described as comprising an optical glass plate, but it is to be understood that the present invention is not limited thereto and that any optical transparent insulation plates may be used as a substrate.

According to the fifth embodiment, as compared with the conventional color filters, large amount of adhesive may be applied when the color filter 302 is bonded to the chip 301. In addition, bubbles can be prevented from being trapped between them. Furthermore, the side edge portions of the color filter 302 can be bonded to the chip 301 with a large amount of adhesive 311, so that a higher degree of adhesive strength can be ensured. Thus, the bonding step can be simplified and yet a high yield and a higher degree of reliability in adhesive strength can be ensured.

Figure 23:
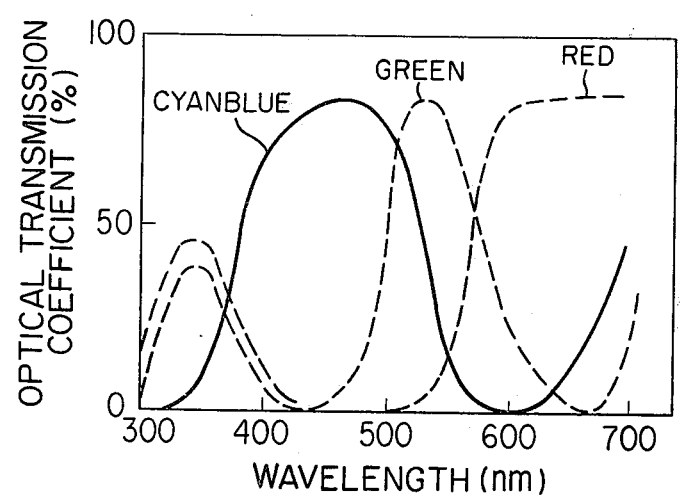
FIG. 23 shows the spectral response of a sixth embodiment; that is, a color filter, which, in addition to three colored light, can transmit ultraviolet rays of a wavelength from 300 to 400 nm so that an adhesive below the color filter can be cured with ultraviolet radiation.

Sixth Embodiment, FIG. 23

According to the sixth embodiment of the present invention, a color filter is so designed and fabricated as to have a spectral characteristic or transmission characteristic as shown in FIG. 23. That is, the color filter is substantially similar in spectral response to the conventional color filters (cyanblue, green and red) in the visible range so that a required degree of color reproduction can be attained. In addition, at least one color filter (cyanblue, green or red) is mixed with a pigment (for instance, a product of Eastman Corp. sold under the trademark of "Eastman Red 901" or "Polyester Blue 4RL" or a mixture of products sold under the trademarks of "Blue GBN" and "Yellow R-GFD") which has at least a few percent and more preferably ten percent of transmission coefficient in the ultraviolet range which has nothing to do with color reproduction.

When such color filter as described above is bonded with an adhesive curable by ultraviolet radiation to a solid-state color-image sensor chip to provide a color-image sensor or an image pickup tube, the following effects, features and advantages can be attained:

(1) The alignment between the stripe or mosaic pattern on the color filter and the picture-element grid on the chip can be easily attained.

(2) Since the color filter can transmit the ultraviolet rays, the adhesive can be cured within a very short time. In addition, it is not needed to increase the intensity of the ultraviolet radiation to such an extent that the color filter is degraded in color.

(3) When all the three color filters; that is, stripes or mosaic elements can transmit the ultraviolet rays from 300 to 400 nm in wavelength, all the adhesive can be cured simultaneously.

(4) Since only a short time interval is required for attaining the correct alignment of the color filter with the chip and then bonding them together, high productivity can be attained.

After bonding, a conventional ultraviolet-and-infrared-ray cut filter (such as C-500) may be used to prevent the light from 300 to 400 nm in wavelength from reaching the photosensors on the color-image sensor.

So far the present invention has been described in detail with reference to a single-plate type color-image sensor, but it is to be understood that the present invention may be equally applied to a two-plate or three-plate type color-image sensor. In addition, the same effects, features and advantages as described previously may be attained when the present invention is applied to the image pickup tubes.

What is claimed is:

1. A solid-state color-image sensor characterized by the provision of
    (a) a first resin layer which is formed over a picture-element grid on a solid-state color-image sensor chip and which is transparent at least to the visible light range,
    (b) a light-shielding layer which is formed over said first resin layer so as to optically shield a predetermined portion of said picture-element grid, and
    (c) a color filter chip comprising a glass substrate and a filter pattern formed thereon, and
    (d) a second resin layer with which said color filter is bonded to said light-shielding layer and which is transparent at least to the visible light range.

2. A process for fabricating solid-state color-image sensors characterized by the steps of
    (a) forming a first resin layer over a picture-element grid on a solid-state color-image sensor chip, said first resin layer being transparent at least to the visible light range,
    (b) forming a light-shielding layer over the first resin layer so as to optically shield an area of said picture-element grid, and
    (c) bonding a color filter fomred on a glass substrate to said light-shielding layer with a second resin which is transparent at least to the visible light range.

3. A process as set forth in claim 2 further characterized in that
    adhesives which are curable by light radiation and exhibit substantially similar optical properties when cured are used as the resin of the first resin layer and second resin.

4. A process as set forth in claim 3 further characterized in that
    in the step for bonding the color filter to the solid-state color-image sensor chip, a resin curable by ultraviolet-ray irradiation is used as an adhesive and is cured by irradiating the ultraviolet-rays in an atmosphere containing oxygen.

5. A process for fabricating solid-state color-image snesors as set forth in claim 3 characterized by
    (a) a first step of forming a thin film of a resin curable by ultraviolet radiation by means of spin coating over the surface of a semiconductor wafer upon which are fabricated a plurality of color-image sensor elements to be divided into individual chips,
    (b) a second step of forming a thin film of a resin curable by ultraviolet radiation by means of spin coating over the surface of an optical glass substrate upon which are formed a plurality of color filter elements to be divided into individual chips,
    (c) a third step of irradiating the thin resin film over the semiconductor wafer with ultraviolet rays using a photo mask so as to cure the thin film of a resin and removing the thin film of a resin which remains uncured with a solvent,
    (d) a fourth step for irradiating the thin resin film over the optical glass substrate on which the color filter is made with the ultraviolet rays using a photo mask so as to cure the thin resin film and removing the thin resin film which remains uncured,
    (e) a fifth step for dividing said semiconductor wafer into individual chips,
    (f) a sixth step for dividing said optical glass substrate into individual color filters,
    (g) a seventh step for dropping a predetermined amount of an adhesive, which is curable by ultraviolet radiation and which, when cured, has substantially the same optical properties as those of the resins which are used in the first and second steps, respectively, and which are curable by ultraviolet radiation, to substantially the center of a chip or a color filter and pressing said chip and said color filter against each other while maintaining them substantially in parallel with each other so that said adhesvie which is curable by ultraviolet radiation is spread between them and fills the space therebetween,
    (h) an eighth step for pressing said chip and said color filter with two parallel plates against each other and displacing said two parallel plates relative to each other while observing the misalignments between said chip and said color filter through one of said two parallel plates pressed against said color filter which one plate is substantially transparent to the visible light and the ultraviolet rays or through a part of said one plate which is substantially transparent to the visible light and the ultraviolet rays, thereby the alignment between the picture-element grid on said chip and the filter pattern on said color filter is attained, and
    (i) a ninth step for irradiating the ultraviolet rays through said one plate or said a part thereof which is substantially transparent to the ultraviolet rays while said chip and said color filter are pressed against each other and the alignment therebetween is maintained, thereby curing said adhesive and subsequently bonding said color filter to said chip.

6. A process as set forth in claim 5 further characterized in that in the third and ninth steps when the ultraviolet rays are irradiated, bonding pads on said chip are masked and the adhesive which remains uncured on the bonding pads after the ultraviolet radiation is removed with a solvent.

* * * * *

UNITED STATES PATENT AND TRADEMARK OFFICE
CERTIFICATE OF CORRECTION

PATENT NO. : 4,418,284
DATED : November 29, 1983
INVENTOR(S) : Kazufumi Ogawa, et al It is certified that error appears in the above-identified patent and that said Letters Patent is hereby corrected as shown below:

Column 3, line 17: "irradition" should be --irradiation--
        lines 60 & 61: "can bonded" should be --can be bonded--

Column 5, line 30: "through a frictional" should be --through the frictional--
        lines 61 & 62: "benzathrone" should be --benzanthrone--

Column 7, line 20: "or" should be --of--
        line 29: "therfore" should be --therefore--

Column 11, line 44: "20 W." should be --50 W.--

Column 12, line 44: "large amount of" should be --a large amount of--

Column 13, line 51: "the visible light range" should be --visible light range--
        lines 56 & 57: "the visible light range" should be --visible light range--

UNITED STATES PATENT AND TRADEMARK OFFICE
CERTIFICATE OF CORRECTION

PATENT NO. : 4,418,284

DATED : November 29, 1983

INVENTOR(S) : Kazufumi Ogawa, et al

It is certified that error appears in the above-identified patent and that said Letters Patent is hereby corrected as shown below:

Column 13, line 61: "fomred" should be --formed-- line 63: "the visible light" should be --visible light--

Column 14, line 46: "adhesvie" should be --adhesive--

Signed and Sealed this

Fifteenth Day of May 1984

[SEAL]

Attest:

GERALD J. MOSSINGHOFF

Attesting Officer  Commissioner of Patents and Trademarks